(12) United States Patent
Sugahara

(10) Patent No.: US 7,317,276 B2
(45) Date of Patent: Jan. 8, 2008

(54) LIQUID DELIVERING DEVICE

(75) Inventor: Hiroto Sugahara, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 524 days.

(21) Appl. No.: 10/927,074

(22) Filed: Aug. 27, 2004

(65) Prior Publication Data

US 2005/0069429 A1   Mar. 31, 2005

(30) Foreign Application Priority Data

Sep. 25, 2003 (JP) .............................. 2003-333977

(51) Int. Cl.
*B41J 2/045* (2006.01)
(52) U.S. Cl. .................... 310/365; 347/68; 347/71; 347/72; 310/324; 310/366
(58) Field of Classification Search ................ 310/324, 310/365; 347/68–72
See application file for complete search history.

(56) References Cited

U.S. PATENT DOCUMENTS 6,074,047 A * 6/2000 Hotomi et al. ................. 347/70
6,575,565 B1   6/2003 Isono

FOREIGN PATENT DOCUMENTS

| JP | 58-108163 | 6/1983 |
|---|---|---|
| JP | A-60-230575 | 11/1985 |
| JP | A-05-001669 | 1/1993 |
| JP | A-2001-96745 | 4/2001 |
| JP | 2001-162796 | 6/2001 |
| JP | A-2002-348677 | 12/2002 |
| JP | A-2003-028068 | 1/2003 |
| JP | A-2003-211394 | 7/2003 |

* cited by examiner

*Primary Examiner*—J. San Martin
(74) *Attorney, Agent, or Firm*—Oliff & Berridge, PLC

(57) ABSTRACT

A liquid delivering device including: (a) a cavity unit defining cavities for accommodating a liquid which is to be delivered to an exterior of the liquid delivering device; (b) a piezoelectric actuator unit superposed on the cavity unit, and having active portions which correspond to the respective cavities and which are selectively deformable upon application of a drive voltage thereto so as to deliver the liquid from the corresponding cavities to the exterior of the liquid delivering device; and (c) a backup plate superposed on the actuator unit such that the actuator unit is interposed between the cavity unit and the backup plate. The backup plate is jointed, at least at portions thereof corresponding to peripheries of the cavities, to the actuator unit. The actuator unit includes (b-1) a piezoelectric material layer deformable upon generation of an electric field therein as a result of the application of the drive voltage to the actuator unit, and (b-2) a flexible layer laminated on the piezoelectric material layer so as to be deformable together with deformation of the piezoelectric material layer.

25 Claims, 8 Drawing Sheets

LIQUID DELIVERING DEVICE

This application is based on Japanese Patent Application No. 2003-333977 filed in Sep. 25, 2003, the content of which is incorporated hereinto by reference.

BACKGROUND OF THE INVENTION

1. Field of the Invention

The present invention relates in general to a liquid delivering device, and more particularly to such a liquid delivering device operable with activation of a piezoelectric material element.

2. Discussion of Related Art

There has been known an ejection device, as disclosed in JP-A-S58-108163, including (a) an oscillating plate which covers a plurality of pressure chambers storing a liquid, and (b) a piezoelectric element which is superposed on the oscillating plate and which has a plurality of active portions selectively activated. In this ejection device, for ejecting the ink delivered from a selected one of the pressure chambers, a corresponding one of the active portions is activated to oscillate or deform a corresponding portion of the oscillating plate, so as to change a pressure within the selected pressure chamber whereby the liquid in the form of a droplet is ejected through a corresponding nozzle which is held in communication with the selected pressure chamber. However, in this instance, not only the selected pressure chamber but also another pressure chamber adjacent to the selected pressure chamber tends to be influenced by the deformation of the oscillating plate, so that a pressure within the adjacent pressure chamber is likely to be somewhat fluctuated. Due to such a cross talk occurring between the adjacent pressure chambers, an amount of the ink delivered from each of the pressure chambers to the corresponding nozzle tends to be fluctuated rather than being constant, thereby making difficult to eject the droplet with a constant volume at a constant velocity.

SUMMARY OF THE INVENTION

The present invention was made in view of the background prior art discussed above. It is therefore an object of the invention to provide a liquid delivering device in which occurrence of the above-described problematic cross talk is reduced. This object may be achieved according to a principle of the present invention, which provides a liquid delivering device comprising: (a) a cavity unit defining a plurality of cavities for accommodating a liquid which is to be delivered to an exterior of the liquid delivering device; (b) a piezoelectric actuator unit superposed on the cavity unit, and having a plurality of active portions which correspond to the respective cavities and which are selectively deformable upon application of a drive voltage thereto so as to deliver the liquid from the corresponding cavities to the exterior of the liquid delivering device; and (c) a backup plate superposed on the piezoelectric actuator unit such that the piezoelectric actuator unit is interposed between the cavity unit and the backup plate, wherein the backup plate is jointed, at least at portions thereof corresponding to peripheries of the cavities, to the piezoelectric actuator unit, and wherein the piezoelectric actuator unit includes (b-1) a piezoelectric material layer which is deformable upon generation of an electric field therein as a result of the application of the drive voltage to the piezoelectric actuator unit, and (b-2) a flexible layer which is laminated on the piezoelectric material layer so as to be deformable together with deformation of the piezoelectric material layer.

In the present liquid delivering device, the backup plate is provided to be superposed on the piezoelectric actuator unit such that the piezoelectric actuator unit is interposed between the cavity unit and the backup plate. The backup plate is jointed, at least at its portions corresponding to the peripheries of the cavities (i.e., corresponding to portions of the cavity unit which are located between the cavities), to the piezoelectric actuator unit. This construction is effective to increase rigidity of portions of the piezoelectric actuator unit which correspond to the portions of the cavity unit located between the cavities, thereby restraining the piezoelectric actuator unit from being deflected or deformed at those portions corresponding to the portions of the cavity unit located between the cavities, and accordingly making it possible to reduce occurrence of the cross talk.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
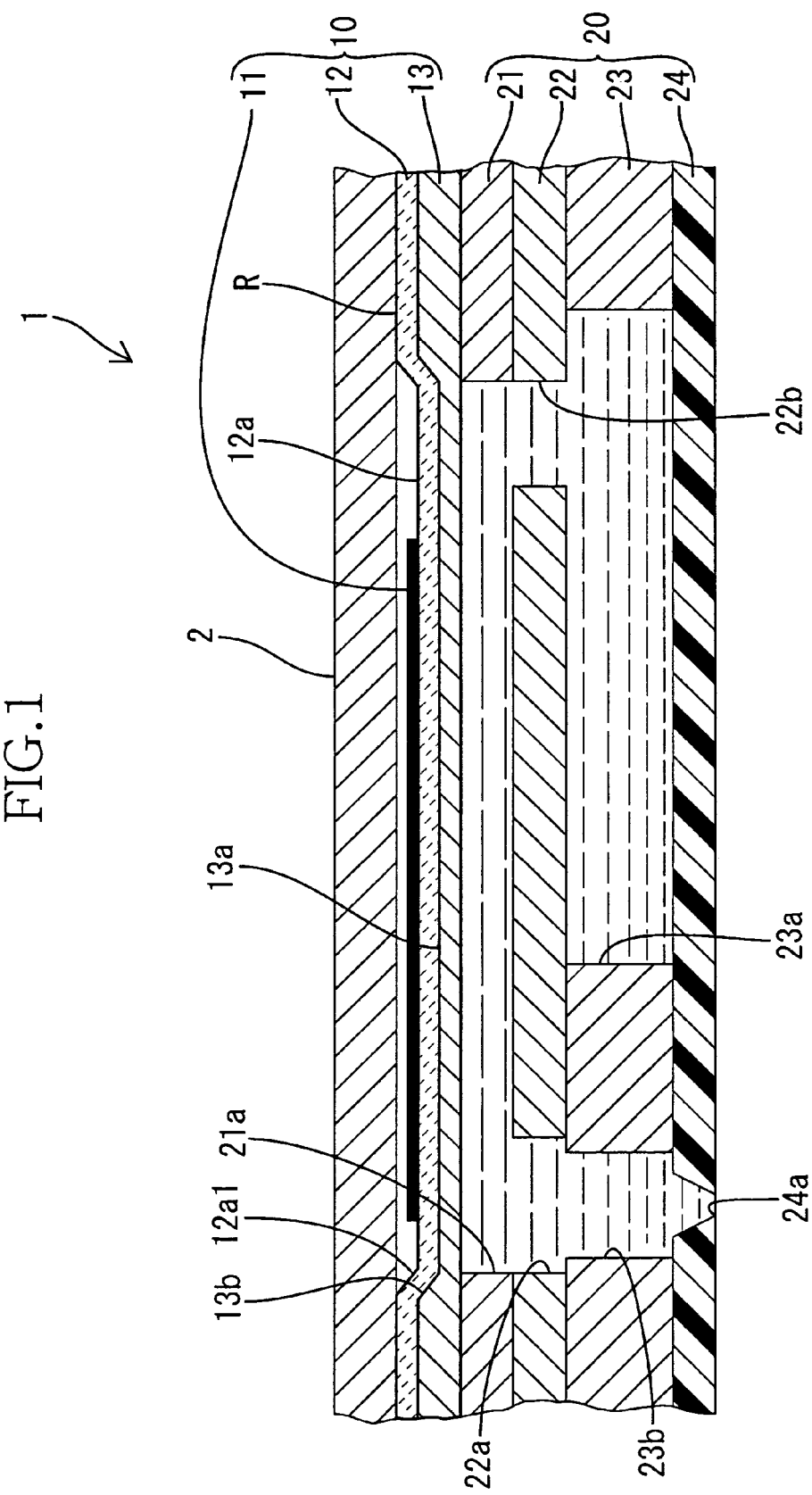
FIG. 1 is a cross sectional view of a liquid delivering device constructed according to a first embodiment of the invention, taken along a longitudinal direction of pressure chambers of the device.

Referring first to FIGS. 1-4, there will be described a liquid delivering device 1 constructed according to a first embodiment of the invention. It is noted that the left half of FIG. 3 corresponds to a plan view of the liquid delivering device 1 and that the right half of FIG. 3 corresponds to a cross sectional view of the device 1 taken in a plane having the same height as pressure chambers 21a.

The liquid delivering device 1 includes a cavity unit in the form of a passage defining unit 20 in which a plurality of pressure chambers 21a are arranged, and a piezoelectric actuator unit 10 which has a plate-like shape as a whole and which is fixedly superposed on the passage defining unit 20. In the passage defining unit 20, there are arranged a plurality of cavities in the form of pressure chambers 21a for accommodating a liquid which is to be eventually ejected from the device 1. The pressure chambers 21a open in an upper surface of the passage defining unit 20, and the openings of the respective pressure chambers 21a are closed by the piezoelectric actuator unit 10 which is superposed on the passage defining unit 20.

The passage defining unit 20 is a laminar structure including: a nozzle plate 24 having a plurality of nozzles 24a formed therethrough; a manifold plate 23 superposed on the nozzle plate 24; a passage plate 22 superposed on the manifold plate 23; and a pressure-chamber plate 21 superposed on the passage plate 22. The plates 21-24 are provided by substantially flat plates, and are fixed to each other by a thermosetting adhesive such as an epoxy bond.

Each of the plates 21-23 is made of a metallic material such as stainless steel. The pressure-chamber plate 21 defines the plurality of pressure chambers 21a, each of which is held in communication at its opposite end portions with a pressure passage 22a and a manifold passage 22b that are defined by the passage plate 22. The manifold plate 23 defines a manifold chamber 23a which is held in communication with a liquid tank (not shown), and nozzle passages 23b each of which is contiguous to the corresponding pressure passage 22a.

The nozzle plate 24 is made of polyimide-based synthetic resin material, and defines the plurality of nozzles 24a each of which is contiguous to the corresponding nozzle passage 23b, as shown in FIG. 1. The liquid stored in the liquid tank is supplied to the nozzles 24a via the manifold chamber 23a, manifold passages 22b, pressure chambers 21a, pressure passages 22a and nozzle passages 23b.

Figure 3:
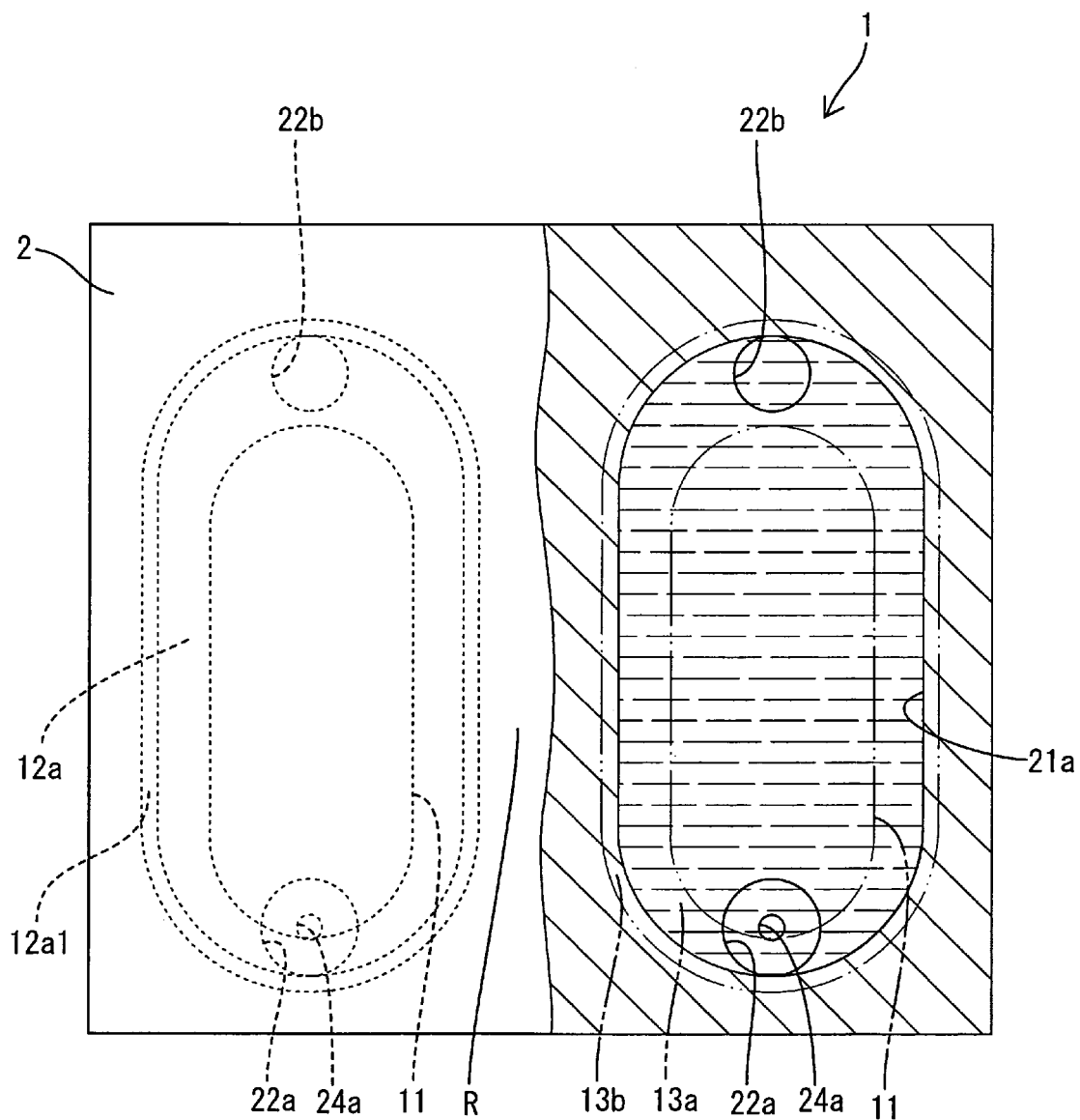
FIG. 3 is a plan view partially in cross section of the liquid delivering device of FIG. 2.

The piezoelectric actuator unit 10 has a plurality of active portions which are aligned with or correspond to the respective pressure chambers 21a and which are selectively deformable upon application of a drive voltage thereto so as to deliver the liquid from the corresponding pressure chambers 21a to the exterior of the liquid delivering device 1. The actuator unit 10 includes a single flexible layer in the form of an oscillating plate 13 which is provided by a generally flat plate made of a conductive metallic material such as stainless steel. In the present embodiment, the oscillating plate 13, which defines upper ends of the respective pressure chambers 21a, is used as a lower electrode which is grounded and constitutes a part of a drive circuit (not shown). The oscillating plate 13 of the actuator unit 10 has a plurality of thin-walled portions 13a located in the respective active portions. In the thin-walled portions 13a, the oscillating plate 13 is recessed at its upper surface (i.e., its surface remote from the pressure chambers 21a), for example, by machining or etching. Thus, the upper surface of the oscillating plate 13 is made lower in the thin-walled portions 13a than in the other portion of the oscillating plate 13. Each of the thin-walled portions 13a, as well as each of the pressure chambers 21a, has a generally oval shape in the plan view as shown in FIG. 3, and is connected to the other portion via a slant surface 13b which surrounds each thin-walled portion 13a. It is noted that each thin-walled portion 13a has a cross sectional area which is substantially equal to or slightly larger than that of the corresponding pressure chamber 21, as viewed in the plan view (i.e., as viewed in a direction perpendicular to a backup plate 2 that is described below), so that deformation of each of the active portions of the piezoelectric actuator unit 10 is not impeded.

The piezoelectric actuator unit 10 further includes a single piezoelectric material layer 12 which is superposed on and fixed to the upper surface of the oscillating plate 13. The piezoelectric material layer 12 is provided by a layer having a constant thickness, so that its upper surface is made lower in its portions located right above the thin-walled portions 13a of the oscillating plate 13, than in the other portion of the layer 12, as shown in FIG. 1. Thus, the piezoelectric material layer 12 has recesses 12a formed in its upper surface, i.e., in one of its opposite side surfaces that is remote from the pressure chambers 21a, such that the recesses 12a are located in the respective active portions of actuator unit 10. It is noted that the piezoelectric material layer 12 is made of lead zirconium titanate (PZT) in the present embodiment. However, the piezoelectric material layer 12 may be made of other piezoelectric material such as barium titanate, lead titanate and Rochelle salt.

Each of the recesses 12a is connected to the other portion of the piezoelectric material layer 12 via a slant surface 12a1 which surrounds each recess 12a. The piezoelectric material layer 12 may be formed on the oscillating plate 13 by either aerosol deposition (AD) method, sputtering, or sol-gel method which includes a piezoelectric-layer forming step of forming the layer by heating a solution applied to the oscillating plate 13. Further, alternatively, the piezoelectric material layer 12 is provided by a layer, which is fixed to the oscillating plate 13 by a conductive adhesive after the layer has been formed. In the respective recesses 12a of the piezoelectric material layer 12, there are provided upper electrodes 11 which are electrically connected to a positive terminal of an electric source of the drive circuit via respective switching elements (not shown). The upper electrodes 11 are provided by thin conductive films which are bonded to or printed on the piezoelectric material layer 12. The upper electrodes 11 cooperate with the piezoelectric material layer 12 and the oscillating plate 13 to constitute the piezoelectric actuator unit 10.

On the upper surface of the piezoelectric material layer 12, there is disposed a backup plate 2, such that the piezoelectric actuator unit 10 is sandwiched between the backup plate 2 and the passage defining unit 20. The backup plate 2 is provided by a flat plate made of a metallic material such as stainless steel and having a predetermined thickness. This backup plate 2 is fixed or jointed, at its portions corresponding to peripheries of the pressure chambers 21a, to portions R of the piezoelectric material layer 12 which correspond to side walls of the pressure chambers 21a or which are located between the pressure chambers 21a, for example, by a thermosetting adhesive such as an epoxy bond.

Figure 2:
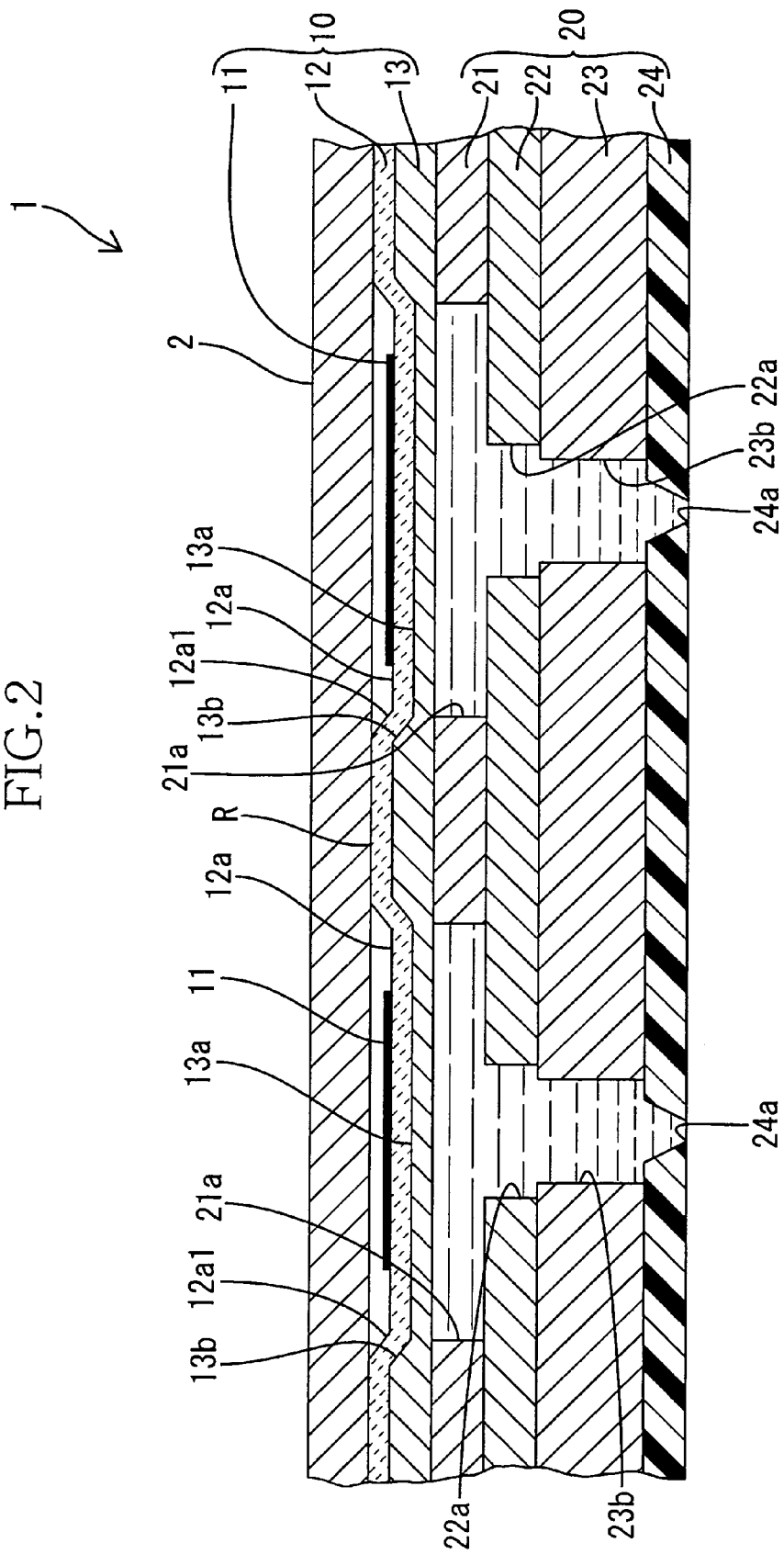
FIG. 2 is a cross sectional view of the liquid delivering device of FIG. 1, taken along a row in which the pressure chambers are arranged.

A lower surface of the backup plate 2, which is opposed to the piezoelectric actuator unit 10, is flat in its entirety. However, as shown in FIGS. 1 and 2, there are provided gaps or spaces between the flat lower surface of the backup plate 2 and the portions of the piezoelectric material layer 12 which correspond to the pressure chambers 21a, owing to the recesses 12a formed in the portions of the piezoelectric material layer 12. The backup plate 2, having a certain degree of rigidity, is jointed to the portions R of the piezoelectric material layer 12 which correspond to the side walls of the pressure chambers 21a, thereby making it possible to restrain the piezoelectric actuator unit 10 from being deflected or deformed at its portions corresponding to the side walls of the pressure chambers 21a. The backup plate 2, which is provided by the flat plate shaped suitably to be disposed on the upper surface of the piezoelectric material layer 12, is fixed or jointed to the portions R of the piezoelectric material layer 12 which correspond to the side walls of the pressure chambers 21a.

The backup plate 2 does not have to be necessarily made of a metallic material, but may be made of other material such as synthetic resin and ceramic which is jointable to the piezoelectric material layer 12 and has a certain degree of rigidity. Further, the backup plate 2 may be formed of a material forming the oscillating plate 13, so as to have the same coefficient of thermal expansion as the oscillating plate 13, thereby making it possible to advantageously minimize a stress acting on the piezoelectric material layer 12 (which is sandwiched between the backup plate 2 and the oscillating plate 13) even under a condition with considerable variation in temperature. This technical advantage can be obtained, even where the backup plate 2 and the oscillating plate 13 are made of respective materials different from each other as long as the respective materials have the same coefficient of thermal expansion.

In the liquid delivering device 1 of the present embodiment, while the device 1 is not required to eject droplets through the nozzles 24a, a drive voltage is not applied between the electrodes so that the piezoelectric actuator unit 10 remains undeformed. When it is required to eject the droplets through each nozzle 24a, the corresponding switching element is turned ON whereby the drive voltage is applied between the corresponding upper electrode 11 and the lower electrode which is provided by the oscillating plate 13. As a result of the application of the drive voltage between the corresponding upper electrode 11 and the lower electrode, an electric field is generated in a portion of the piezoelectric material layer 12 which constitutes a part of the corresponding active portion of the actuator unit 10, so that the portion of the piezoelectric material layer 12 expands in its thickness direction (i.e., in the vertical direction as seen in FIG. 2) and contracts in its surface direction (i.e., in the horizontal direction as seen in FIGS. 1 and 2).

Figure 4:
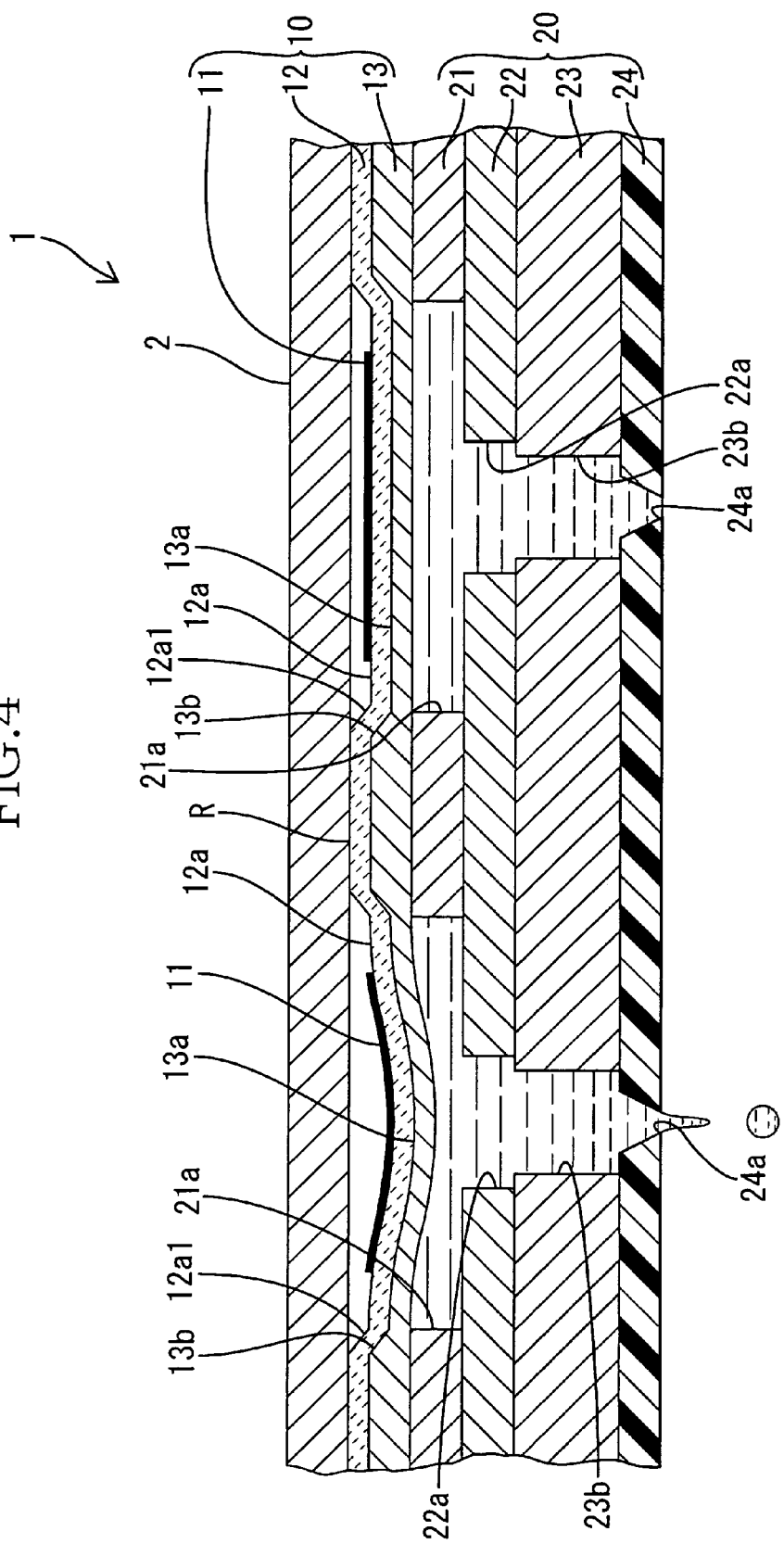
FIG. 4 is a cross sectional view of the liquid delivering device of FIG. 2, showing its operating state.

In this instance, as shown in the left-side part of FIG. 4, the contraction of the above-described portion of the piezoelectric material layer 12 in the surface direction results in its deformation together with the oscillating plate 13 in a direction toward the corresponding pressure chamber 21a (i.e., in the downward direction as seen in FIG. 4), since the thin-walled portions 13a of the oscillating plate 13 having the certain degree of rigidity underlie the above-described portion of the piezoelectric material layer 12. With the deformation of the active portion of the piezoelectric actuator unit 10 (which portion corresponds to the corresponding pressure chamber 21a) toward the pressure chamber 21a, a pressure in the pressure chamber 21a is increased as a result of reduction in a volume of the pressure chamber 21a, whereby the ink is delivered from the pressure chamber 21a to the nozzle 24a via the pressure passage 22a and the nozzle passage 23b, and the ink in the form of droplets is then ejected through the nozzle 24a. Meanwhile, the portions R of the piezoelectric material layer 12 corresponding to the side walls of the pressure chambers 21a maintain their original shapes without being deflected or deformed, since the backup plate 2 having the rigidity is jointed to the portions R of the piezoelectric material layer 12.

When the switching element is turned OFF after the ejection of the droplets through the nozzle 24a, the above-described portion of the piezoelectric material layer 12 (which has contracted in its surface direction) restores its original undeformed shape as a result of suspension of the application of the drive voltage between the electrodes, whereby the above-described portion of the piezoelectric actuator unit 10 returns to its original position, as shown in FIG. 2. With the return of the portion of the piezoelectric-actuator unit 10 to its original position, the pressure in the pressure chamber 21a is reduced as a result of increase in the volume of the pressure chamber 21a, whereby the pressure chamber 21a is refilled with the liquid which is delivered thereto from the liquid tank via the manifold chamber 23a and the manifold passage 22b.

As described above, in the present liquid delivering device 1, the backup plate 2 is provided to be superposed on the piezoelectric actuator unit 10 such that the piezoelectric actuator unit 10 is interposed between the passage defining unit 20 and the backup plate 2. The backup plate 2 is jointed, at its portions which correspond to the side walls of the pressure chambers 21a, to the piezoelectric actuator unit 10. This construction is effective to increase rigidity of the portions of the piezoelectric actuator unit 10 which correspond to the side walls of the pressure chambers 21a, thereby restraining the oscillating plate 13 from being deflected or deformed, at its portions corresponding to the side walls of the pressure chambers 21a, toward the pressure chambers 21a, and making it possible to reduce occurrence of a so-called cross talk between the adjacent pressure chambers 21a.

Further, in the present liquid delivering device 1, the piezoelectric material layer 12 is superposed on the oscillating plate 13 which has the thin-walled portions 13a located in the respective portions corresponding to the respective pressure chambers 21a, so that the piezoelectric material layer 12 is given the recesses 12a which are located right above the respective thin-walled portions 13a. Since the piezoelectric actuator unit 10 is thus spaced at its portions corresponding to the pressure chambers 21a from the backup plate 2, these portions of the piezoelectric actuator unit 10 are not restricted in their displacements, and accordingly are not impeded from being deflected or deformed toward the pressure chambers 21a. Further, since the portions of the oscillating plate 13 which correspond to the respective pressure chambers 21a are provided by the thin-walled portions 13a, these portions of the oscillating plate 13 are given a relatively low rigidity and are accordingly capable of being deflected or deformed by a large amount.

Further, since the lower surface of the backup plate 2 (which surface is opposed to the actuator unit 10) is flat in its entirety without a recess or hole opening therein, it can be easily manufactured at a low cost, and does not have to be accurately positioned relative to the piezoelectric material layer 12 of the actuator unit 10 when it is jointed to the piezoelectric material layer 12. Further, the high rigidity of the backup plate 2 is effective to further reliably restrain occurrence of the cross talk. Still further, since the piezoelectric material layer 12 is covered at its entirety by the backup plate 2, the upper electrodes 11 and the piezoelectric material layer 12 are protected by the backup plate 2 against damaging which could be caused if they are brought into contact with an operator or a foreign object, for example, while the liquid delivering device 1 is being transferred.

In addition, where the piezoelectric material layer 12 is formed on the oscillating plate 13 in accordance with aerosol deposition (AD) method, the formation can be made in a short length of time. Further, where the oscillating plate 13 is made of a conductive material and is fixed to the piezoelectric material layer 12 by a conductive adhesive, the oscillating plate 13 can serve as the lower electrode which cooperates with the upper electrodes 11 for generating the electric field across the piezoelectric material layer 12. This arrangement eliminates necessity of provision of a member serving exclusively as the lower electrode, thereby reducing the manufacturing cost. Further, where the piezoelectric material layer 12 is formed on the oscillating plate 13 by sputtering or sol-gel method, the piezoelectric material layer 12 can be easily made to have a constant thickness.

Figure 5:
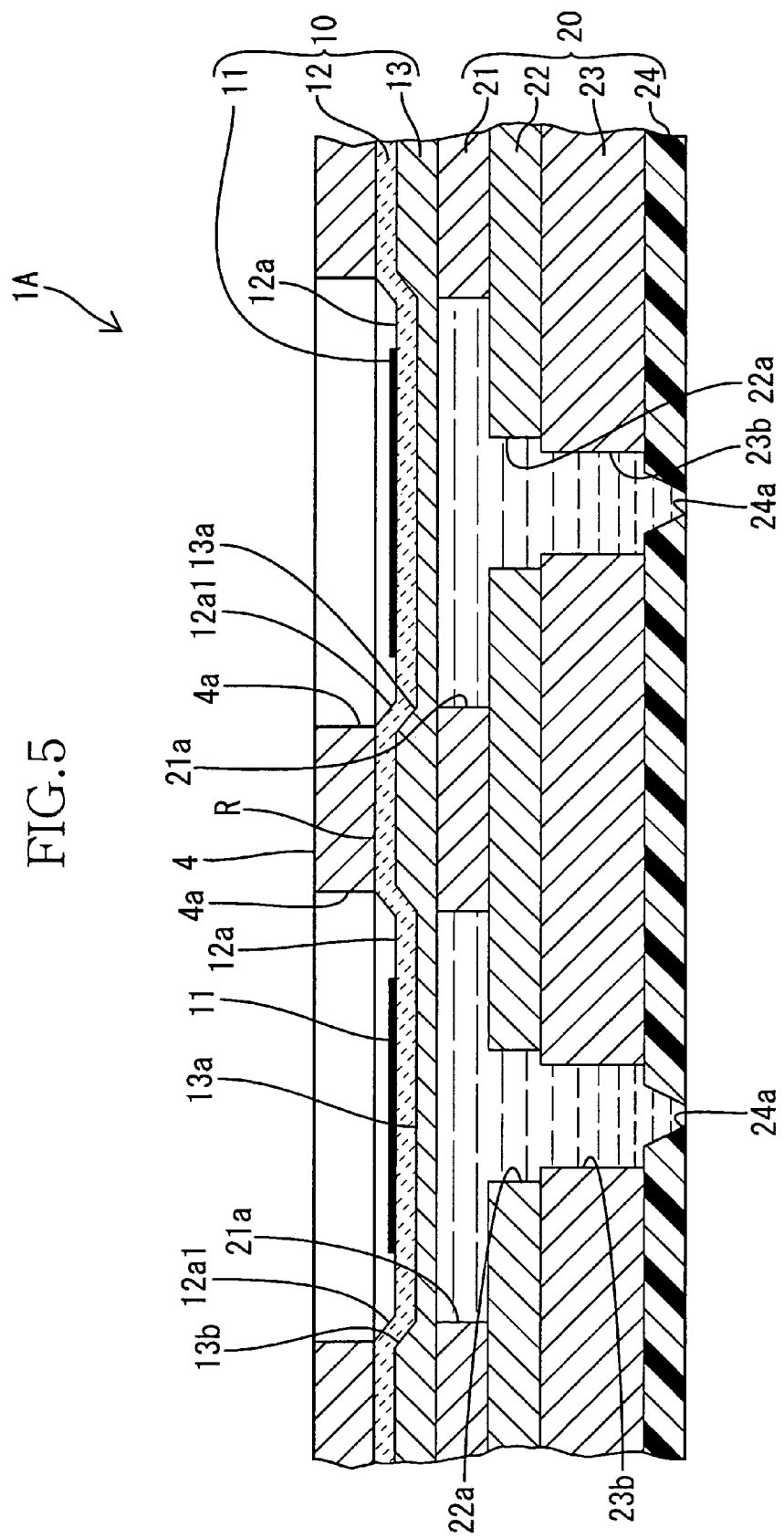
FIG. 5 is a cross sectional view of a liquid delivering device constructed according to a second embodiment of the invention, taken along a row in which the pressure chambers are arranged.
Figure 6:
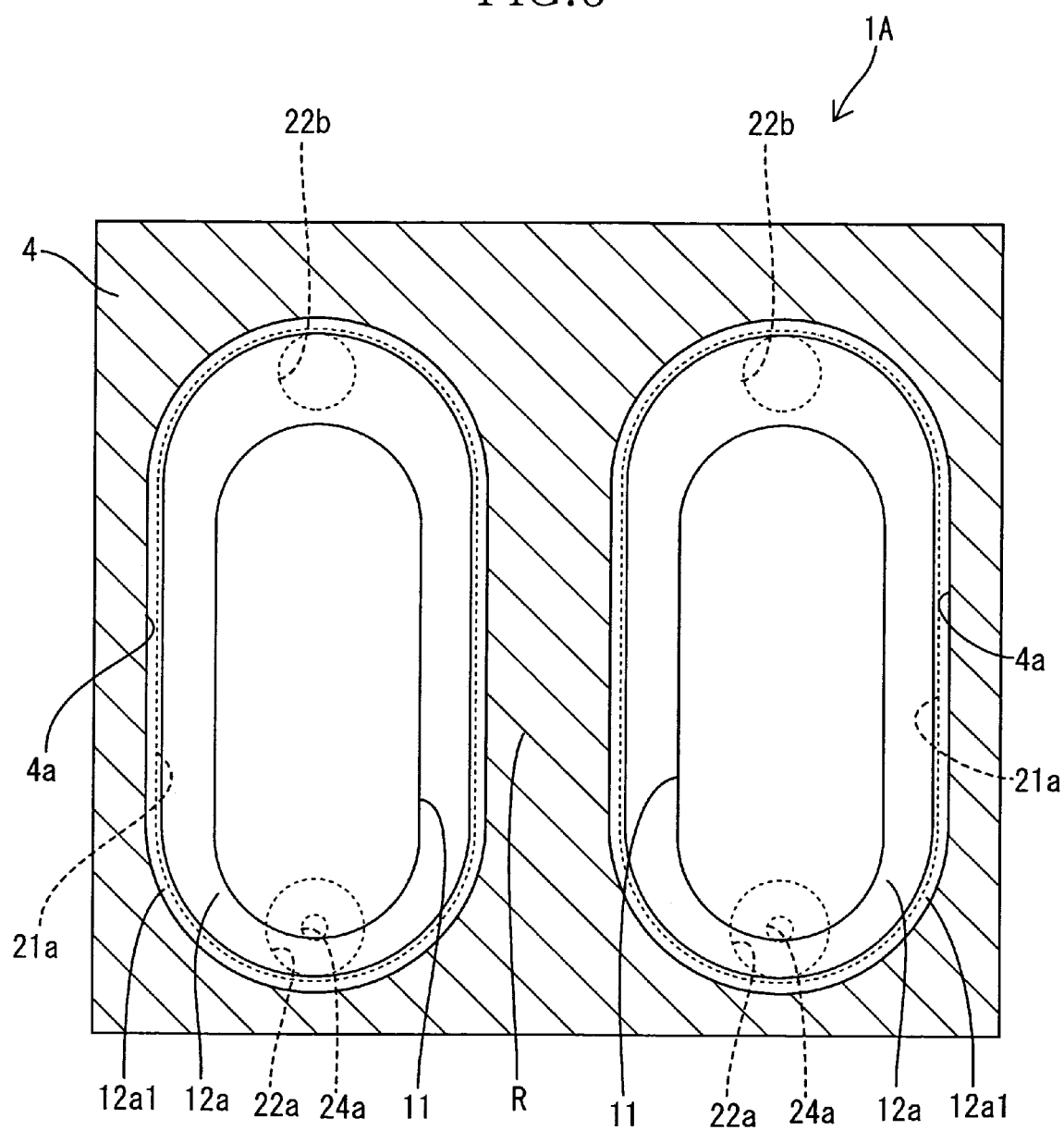
FIG. 6 is a plan view of the liquid delivering device of FIG. 5.

Referring next to FIGS. 5 and 6, there will be described a liquid delivering device 1A which is constructed according to a second embodiment of the invention. In FIGS. 5 and 6, the same reference signs as used in FIGS. 1-4 are used to identify the same components or elements, which will not be described to avoid redundancy of description.

This liquid delivering device 1A is substantially identical with the above-described liquid delivering device 1 of the first embodiment, except that the backup plate 2 is replaced by a backup plate 4 which has through-holes 4a located in its portions corresponding to or aligned with the respective pressure chambers 21a in the vertical direction. Each of the through-holes 4a has a generally oval shape which is slightly larger than that of the corresponding pressure chamber 21a, as viewed in the plan view of FIG. 6. Like the backup plate 2 of the device 1 of the first embodiment, the backup plate 4 is fixed or jointed, at its portions corresponding to peripheries of the pressure chambers 21a, to portions R of the piezoelectric material layer 12 which correspond to side walls of the pressure chambers 21a or which are located between the pressure chambers 21a, such that the piezoelectric actuator unit 10 is interposed between the backup plate 4 and the passage defining unit 20. It is noted that the through-holes 4a may be formed by either machining or etching.

The backup plate 4 is made of a metallic material such as stainless steel and has a certain degree of rigidity. The backup plate 4 is fixed or jointed, at its portions corresponding to the peripheries of the pressure chambers 21a, to the portions R of the piezoelectric material layer 12 which correspond to the side walls of the pressure chambers 21a or which are located between the pressure chambers 21a, thereby making it possible to restrain the piezoelectric actuator unit 10 from being deflected or deformed at its portions corresponding to the side walls of the pressure chambers 21a. Like the backup plate 2 in the first embodiment, the backup plate 4 does not have to be necessarily made of a metallic material, but may be made of other material such as synthetic resin and ceramic which is jointable to the piezoelectric material layer 12 and provides a certain degree of rigidity.

Further, like the backup plate 2 in the first embodiment, the backup plate 4 may be formed of the same material as the oscillating plate 13, or a different material having the same coefficient of thermal expansion as the material forming the oscillating plate 13, thereby making it possible to minimize a stress acting on the piezoelectric material layer 12 (which is sandwiched between the backup plate 4 and the oscillating plate 13) even under a condition with considerable variation in temperature. Since the piezoelectric actuator unit 10 is activated or operated in the same manner as in the first embodiment, redundant description of the operation of the actuator unit 10 is not provided.

Further, like in the liquid delivering device 1 of the first embodiment, the backup plate 4 is provided to be superposed on the piezoelectric actuator unit 10 such that the piezoelectric actuator unit 10 is interposed between the passage defining unit 20 and the backup plate 4. The backup plate 4 is jointed, at its portions which correspond to the side walls of the pressure chambers 21a, to the piezoelectric actuator unit 10. This construction increases rigidity of the portions of the piezoelectric actuator unit 10 which correspond to the side walls of the pressure chambers 21a, thereby restraining the oscillating plate 13 from being deflected or deformed, at its portions corresponding to the side walls of the pressure chambers 21a, toward the pressure chambers 21a, and making it possible to reduce occurrence of the cross talk between the adjacent pressure chambers 21a.

Further, owing to the through-holes 4a formed through the portions of the backup plate 4 which correspond to the pressure chambers 21a, the backup plate 4 does not increase the rigidity of an upper part of each of the portions of the piezoelectric actuator unit 10 which correspond to the pressure chambers 21a (i.e., the rigidity of the part of each of these portions of the actuator unit 10, which part is remote from the pressure chambers 21a), whereby these portions of the actuator unit 10 are not impeded from being deflected or deformed toward the pressure chambers 21a. Further, the through-holes 4a formed through the backup plate 4 facilitates a visual inspection of the inside of the liquid delivering device 1A after the backup plate 4 has been attached to the actuator unit 10 in process of manufacturing the device 1A.

Figure 7:
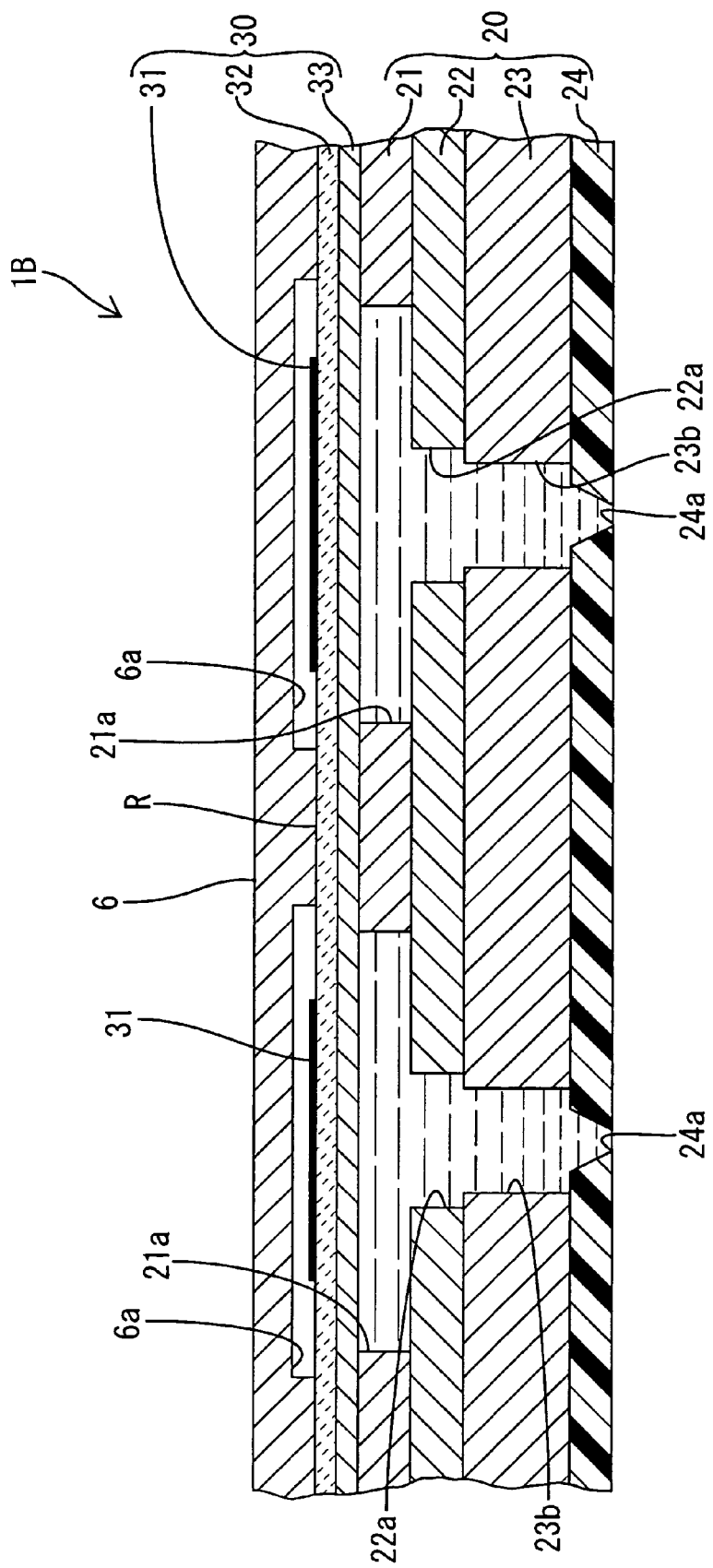
FIG. 7 is a cross sectional view of a liquid delivering device constructed according to a third embodiment of the invention, taken along a row in which the pressure chambers are arranged.

Referring next to FIG. 7, there will be described a liquid delivering device 1B which is constructed according to a third embodiment of the invention. In FIG. 7, the same reference signs as used in FIGS. 1-4 are used to identify the same components or elements, which will not be described. This liquid delivering device 1B is substantially identical with the above-described liquid delivering device 1 of the first embodiment, except that the backup plate 2 and the piezoelectric actuator unit 10 are replaced by a backup plate 6 and a piezoelectric actuator unit 30, which are described below.

The piezoelectric actuator unit 30 is constituted by upper electrodes 31, a piezoelectric material layer 32 and an oscillating plate 33 which serves as the flexible layer. Like the oscillating plate 13 of the liquid delivering device 1 of the first embodiment, the oscillating plate 33 is superposed on the upper surface of the passage defining unit 20 to define the upper ends of the respective pressure chambers 21a which open in the upper surface of the passage defining unit 20. However, unlike the oscillating plate 13, the oscillating plate 33 is provided by a flat plate having a thickness that is constant in its entirety, and does not have thin-walled portions (like the thin-walled portions 13a which are located in the portions of the oscillating plate 13 corresponding to the respective pressure chambers 21a). The piezoelectric material layer 32 is also provided by a flat plate having a thickness that is constant in its entirety, and does not have recesses (such as the recesses 12a which are located in the portions of the piezoelectric material layer 12 corresponding to the respective pressure chambers 21a). On portions of the piezoelectric material layer 32 which correspond to the pressure chambers 21a, there are disposed upper electrodes 31 which are substantially identical with the upper electrodes 11 of the device 1 of the first embodiment. Like the upper electrodes 11, the upper electrodes 31 which are electrically connected to a positive terminal of an electric source of a drive circuit (not shown) via respective switching elements (not shown), while the oscillating plate 33 made of a conductive metallic material such as stainless steel serves as a lower electrode which is grounded and constitutes a part of the drive circuit.

The backup plate 6, which is jointed to the piezoelectric material layer 32, is provided by a generally flat plate, and has recesses 6a formed in its surface opposed to the piezoelectric material layer 32 such that the recesses 6a are located in respective portions of the backup plate 5 which correspond to the pressure chambers 21a. Like each of the through-holes 4a in the second embodiment, each of the recesses 6a has a generally oval shape which is substantially equal in size to or slightly larger than the corresponding pressure chamber 21a, as viewed in the plan view.

Like the backup plate 2 of the device 1 of the first embodiment, the backup plate 6 is fixed or jointed, at its portions corresponding to the peripheries of the pressure chambers 21a, to portions R of the piezoelectric material layer 32 which correspond to the side walls of the pressure chambers 21a or which are located between the pressure chambers 21a, such that the piezoelectric actuator unit 30 is interposed between the backup plate 6 and the passage defining unit 20. In the present third embodiment, although the piezoelectric material layer 32 does not have recesses, the piezoelectric actuator unit 30 can be spaced, at its active portions corresponding to the pressure chambers 21a, from the backup plate 6, owing to the recesses 6a formed in the lower surface of the backup plate 6. It is noted that the recesses 6a may be formed by either machining or half-etching.

The backup plate 6 is made of a metallic material such as stainless steel and has a certain degree of rigidity. The backup plate 6 is fixed or jointed, at its portions corresponding to the peripheries of the pressure chambers 21a, to the portions R of the piezoelectric material layer 32 which correspond to the side walls of the pressure chambers 21a or which are located between the pressure chambers 21a. Like the backup plate 2 in the first embodiment, the backup plate 6 does not have to be necessarily made of a metallic material, but may be made of other material such as synthetic resin and ceramic which is jointable to the piezoelectric material layer 32 and provides a certain degree of rigidity.

Further, like the backup plate 2 in the first embodiment, the backup plate 6 may be formed of the same material as the oscillating plate 33, or a different material having the same coefficient of thermal expansion as the material forming the oscillating plate 33, thereby making it possible to minimize a stress acting on the piezoelectric material layer 32 (which is sandwiched between the backup plate 6 and the oscillating plate 33) even under a condition with considerable variation in temperature. Since the piezoelectric actuator unit 30 is activated or operated in the same manner as in the first embodiment, description of the operation of the actuator unit 30 is not provided.

Further, like in the liquid delivering device 1 of the first embodiment, the backup plate 6 is provided to be superposed on the piezoelectric actuator unit 30 such that the piezoelectric actuator unit 30 is interposed between the passage defining unit 20 and the backup plate 6. The backup plate 6 is jointed, at its portions which correspond to the side walls of the pressure chambers 21a, to the piezoelectric actuator unit 30. This construction increases rigidity of the portions of the piezoelectric actuator unit 30 which correspond to the side walls of the pressure chambers 21a, thereby restraining the oscillating plate 33 from being deflected or deformed, at its portions corresponding to the side walls of the pressure chambers 21a, toward the pressure chambers 21a, and making it possible to reduce occurrence of the cross talk between the adjacent pressure chambers 21a.

Further, owing to the recesses 6a formed in respective portions of the lower surface of the backup plate 6 which correspond to the pressure chambers 21a, the piezoelectric actuator unit 30 is spaced at its portions corresponding to the pressure chambers 21a from the backup plate 2, these portions of the piezoelectric actuator unit 30 are not restricted in their displacements, and accordingly are not impeded from being deflected or deformed toward the pressure chambers 21a. Further, since the piezoelectric material layer 32 is covered at its entirety by the backup plate 6, the upper electrodes 31 and the piezoelectric material layer 32 are protected by the backup plate 6, against damaging which could be caused if they are brought into contact with an operator or a foreign object, for example, while the liquid delivering device 1B is being transferred.

Figure 8:
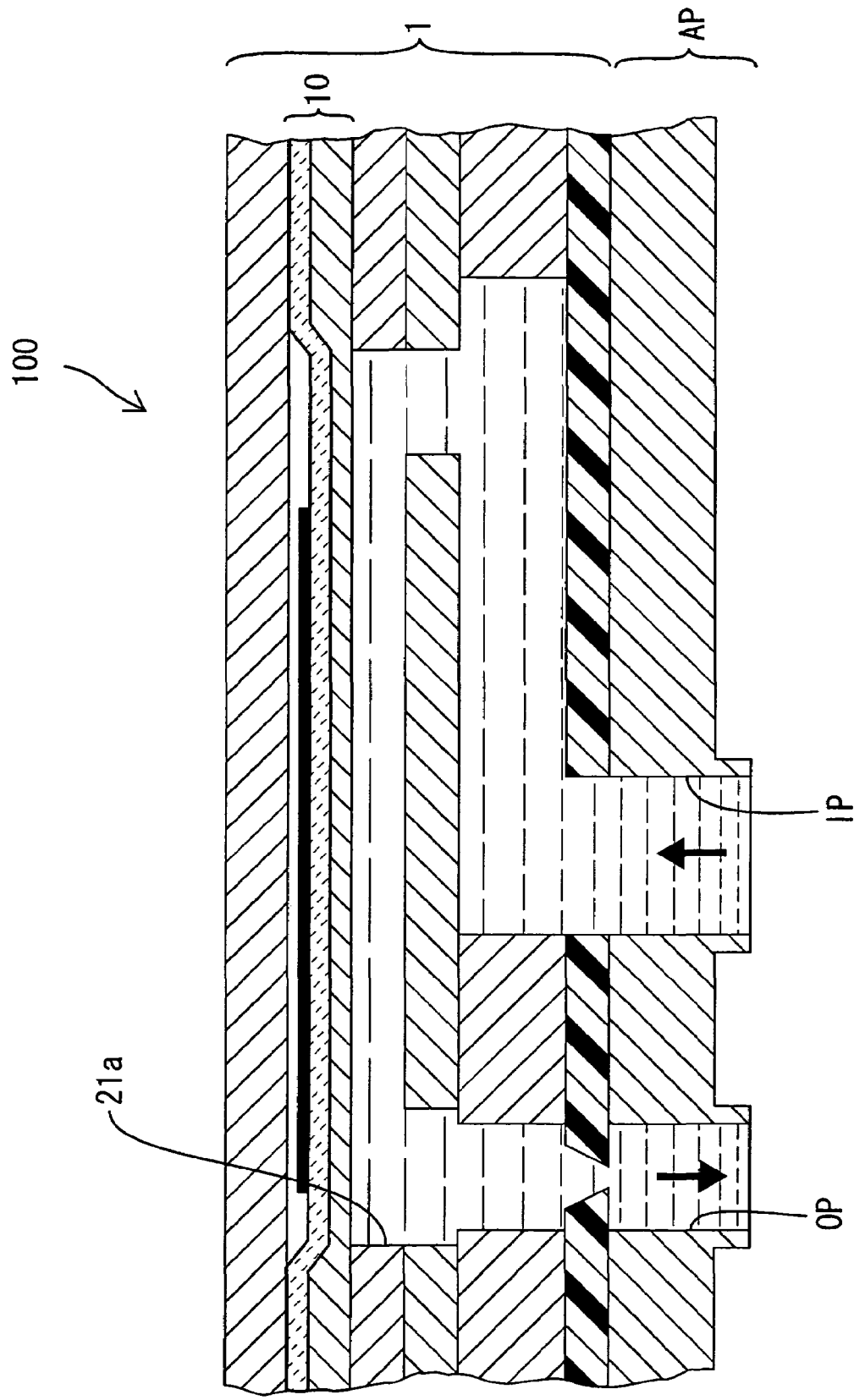
FIG. 8 is a cross sectional view of a micro pump which incorporates the liquid delivering device of FIG. 1.

FIG. 8 shows a fourth embodiment of the present invention in which the liquid delivering device 1 of the first embodiment is incorporated in a micro pump 100. This micro pump 100 includes, in addition to the liquid delivering device 1, a pump adaptor AP which has an inlet port IP and a plurality of outlet ports OP. The adapter AP is connected to a lower surface of the liquid delivering device 1, and is immersed at its lower portion in the liquid reserved in a liquid reservoir. By deflecting or deforming the piezoelectric actuator unit 10 toward the pressure chambers 21a in the liquid delivering device 1, the liquid is delivered from the pressure chambers 21a to the exterior of the micro pump 100 through the outlet ports OP. Then, by returning the actuator unit 10 to its original position, (namely, by restoring the actuator unit 10 to its original shape,) the volume of each pressure chamber 21a is increased whereby the pressure chamber 21a is refilled with the liquid delivered thereto from the liquid reservoir through the inlet port IP.

While the presently preferred embodiments of the present invention have been described above in detail, it is to be understood that the invention is not limited to the details of the illustrated embodiments, but may be otherwise embodied.

In the above-described embodiments, the upper electrodes are connected to the positive terminal of the electric source of the drive circuit while the oscillating plate as the flexible layer is grounded. However, such an electrical arrangement may be modified such that the upper electrodes are grounded while the oscillating plate is connected to the positive terminal of the electric source.

The term "delivering" of the liquid delivering device according to the present invention may be interpreted to mean either spouting, emitting, ejecting, jetting or otherwise delivering. Further, the liquid delivering device may be arranged such that the liquid takes the form of either droplet or mist, after it has been spouted, emitted, ejected or jetted out of the device through outlets such as nozzles which are held in communication with the respective pressure chambers. In this sense, the liquid delivering device may be referred also to as a fluid delivering device.

The jointed portions of the piezoelectric material layer, at which the piezoelectric material layer is jointed to the backup plate, may include, in addition to the portions corresponding to the side walls of the pressure chambers, portions corresponding to radially outer portions of the pressure chambers, as long as occurrence of the cross talk can be effectively reduced.

In the above-described embodiments, the piezoelectric actuator unit is deflected or deformed toward the pressure chambers upon generation of the electric field across the piezoelectric material layer. However, the actuator unit may be arranged to be deformed in a direction away from the pressure chambers upon generation of the electric field across the piezoelectric material layer. The electrical arrangement for the generation of the electric field may be modified so as to change the direction in which the piezoelectric material layer is to be deformed. That is, the piezoelectric material layer may be arranged to be deformed in any direction upon generation of the electric field thereacross.

The liquid delivering device according to the present invention may be arranged to deliver any kinds of liquid to the exterior of the device. That is, the liquid delivering device of the present invention encompasses, for example, an inkjet print head arranged to eject an ink as the liquid through nozzles and an ejection device arranged to eject a reagent used for an inspection.

In the above-described embodiments, the oscillating plate is made of a metallic material so as to serve as the electrode. However, where the oscillating plate is not used as the electrode, it does not necessarily have to be made of a metallic material but may be made of any other kinds of material such as synthetic resin and ceramic which permits the oscillating plate to be deflected or deformed together with the piezoelectric material layer.

In the above-described second embodiment, each of the through-holes 4a has a cross sectional area slightly larger than that of the corresponding pressure chamber 21a as viewed in the plan view. However, the cross sectional area of each through-hole 4a may be either larger or smaller than that of the corresponding pressure chamber 21a.

In the above-described third embodiment, the backup plate 6 has the recesses 6a each having a cross sectional area substantially equal to or slightly larger than that of the corresponding pressure chamber 21a as viewed in the plan view. However, these recesses 6a may be replaced with through-holes formed through the backup plate 6.

It is to be understood that the present invention may be embodied with various other changes, modifications and improvements, which may occur to those skilled in the art, without departing from the sprit and scope of the invention.

What is claimed is:

1. A liquid delivering device comprising:
   (a) a cavity unit defining a plurality of cavities for accommodating a liquid which is to be delivered to an exterior of said liquid delivering device;
   (b) a piezoelectric actuator unit superposed on said cavity unit, and having a plurality of active portions which correspond to the respective cavities and which are selectively deformable upon application of a drive voltage thereto so as to deliver the liquid from the corresponding cavities to the exterior of said liquid delivering device; and
   (c) a backup plate superposed on said piezoelectric actuator unit such that said piezoelectric actuator unit is interposed between said cavity unit and said backup plate,
   wherein said backup plate is jointed, at least at portions thereof corresponding to peripheries of said cavities, to said piezoelectric actuator unit,
   wherein said piezoelectric actuator unit includes (b-1) a piezoelectric material layer which extends over said plurality of cavities and which is deformable upon generation of an electric field therein as a result of the application of the drive voltage to said piezoelectric actuator unit, and (b-2) a flexible layer which extends over said plurality of cavities and which is laminated on said piezoelectric material layer so as to be deformable together with deformation of said piezoelectric material layer,
   and wherein said piezoelectric material layer includes (b-1-1) a plurality of aligned portions each of which is aligned with a corresponding one of said cavities and each of which constitutes a part of a corresponding one of said active portions and (b-1-2) a plurality of interconnecting portions interconnecting said aligned portions.

2. The liquid delivering device according to claim 1, wherein said piezoelectric material layer consists of a single layer, and said flexible layer consists of a single layer.

3. The liquid delivering device according to claim 1,
   wherein said backup plate has a surface opposed to said piezoelectric actuator unit,
   and wherein said surface of said backup plate is flat without a hole opening therein.

4. The liquid delivering device according to claim 1, wherein said backup plate and said flexible layer are formed of respective materials having substantially the same coefficient of thermal expansion.

5. The liquid delivering device according to claim 1, wherein said backup plate and said flexible layer are formed of substantially the same material.

6. The liquid delivering device according to claim 1, wherein said flexible layer is formed of a conductive material so as to serve as one of a pair of electrodes through which the drive voltage is applied to each of said active portions of said piezoelectric actuator unit.

7. The liquid delivering device according to claim 6,
   wherein said piezoelectric actuator unit further includes a plurality of electrodes each of which serves as the other of said pair of electrodes,
   and wherein said plurality of electrodes are disposed on one of opposite sides of said piezoelectric material layer that is remote from said flexible layer, and are positioned in respective positions corresponding to the respective cavities.

8. The liquid delivering device according to claim 1, wherein said piezoelectric material layer which is laminated on said flexible layer is formed in accordance with an aerosol deposition method.

9. The liquid delivering device according to claim 1, wherein said piezoelectric material layer which is laminated on said flexible layer is formed by heating a solution applied on said flexible layer.

10. The liquid delivering device according to claim 1, wherein said piezoelectric material layer which is laminated on said flexible layer is formed by sputtering on said flexible layer.

11. The liquid delivering device according to claim 1, wherein said piezoelectric material layer is fixed to said flexible layer by a conductive adhesive.

12. The liquid delivering device according to claim 1, further comprising a plurality of nozzles which are held in communication with the respective cavities and through which an ink as the liquid accommodated in said cavities is ejected to the exterior of said liquid delivering device, so that said liquid deliver device constitutes an inkjet print head.

13. A micro pump comprising:
   the liquid delivering device defined in claim 1; and
   a pump adapter having an inlet port and a plurality of outlet ports, and connected to said liquid delivering device such that said inlet port is held in communication with said cavities while said outlet ports are held in communication with the corresponding cavities,
   wherein said inlet port of said pump adapter is to be immersed in the liquid reserved in a liquid reservoir, so that the liquid is delivered from the liquid reservoir to an exterior of said micro pump through said inlet port, said cavities and said outlet ports.

14. The liquid delivering device according to claim 1,
   wherein said piezoelectric actuator unit is bonded, at portions thereof corresponding to said peripheries of said cavities, to said backup plate, and wherein said piezoelectric actuator unit is not bonded, at said active portions thereof, to said backup plate.

15. The liquid delivering device according to claim 1, wherein the backup plate is spaced apart from said piezoelectric actuator unit at least at portions corresponding to said active portions, to form recesses between the backup plate and the piezoelectric actuator unit.

16. A liquid delivering device comprising:
   (a) a cavity unit defining a plurality of cavities for accommodating a liquid which is to be delivered to an exterior of said liquid delivering device;
   (b) a piezoelectric actuator unit superposed on said cavity unit, and having a plurality of active portions which correspond to the respective cavities and which are selectively deformable upon application of a drive voltage thereto so as to deliver the liquid from the corresponding cavities to the exterior of said liquid delivering device; and
   (c) a backup plate superposed on said piezoelectric actuator unit such that said piezoelectric actuator unit is interposed between said cavity unit and said backup plate,
   wherein said backup plate is jointed, at least at portions thereof corresponding to peripheries of said cavities, to said piezoelectric actuator unit,
   wherein said piezoelectric actuator unit includes (b-1) a piezoelectric material layer which is deformable upon generation of an electric field therein as a result of the application of the drive voltage to said piezoelectric actuator unit, and (b-2) a flexible layer which is laminated on said piezoelectric material layer so as to be deformable together with deformation of said piezoelectric material layer,
   and wherein said flexible layer has a plurality of thin-walled portions in respective portions thereof each of which constitutes a part of a corresponding one of said active portions, such that said piezoelectric material layer superposed on said flexible layer is spaced apart from said backup plate in said active portions.

17. The liquid delivering device according to claim 16, wherein each of said plurality of thin-walled portions has a cross sectional area which is as large as a cross sectional area of a corresponding one of said plurality of cavities as viewed in a direction perpendicular to said backup plate.

18. The liquid delivering device according to claim 16, wherein each of said plurality of thin-walled portions has a cross sectional area which is larger than a cross sectional area of a corresponding one of said plurality of cavities as viewed in a direction perpendicular to said backup plate.

19. A liquid delivering device comprising:
   (a) a cavity unit defining a plurality of cavities for accommodating a liquid which is to be delivered to an exterior of said liquid delivering device;
   (b) a piezoelectric actuator unit superposed on said cavity unit, and having a plurality of active portions which correspond to the respective cavities and which are selectively deformable upon application of a drive voltage thereto so as to deliver the liquid from the corresponding cavities to the exterior of said liquid delivering device; and
   (c) a backup plate superposed on said piezoelectric actuator unit such that said piezoelectric actuator unit is interposed between said cavity unit and said backup plate,
   wherein said backup plate is jointed, at least at portions thereof corresponding to peripheries of said cavities, to said piezoelectric actuator unit,
   wherein said piezoelectric actuator unit includes (b-1) a piezoelectric material layer which is deformable upon generation of an electric field therein as a result of the application of the drive voltage to said piezoelectric actuator unit, and (b-2) a flexible layer which is laminated on said piezoelectric material layer so as to be deformable together with deformation of said piezoelectric material layer,
   and wherein said backup plate has a plurality of through-holes formed through respective portions. thereof which correspond to the respective active portions of said piezoelectric actuator unit.

20. The liquid delivering device according to claim 19, wherein each of said plurality of through-holes has a cross sectional area which is as large as a cross sectional area of a corresponding one of said plurality of cavities as viewed in a direction perpendicular to said backup plate.

21. The liquid delivering device according to claim 19, wherein each of said plurality of through-holes has a cross sectional area which is larger than a cross sectional area of a corresponding one of said plurality of cavities as viewed in a direction perpendicular to said backup plate.

22. A liquid delivering device comprising:
   (a) a cavity unit defining a plurality of cavities for accommodating a liquid which is to be delivered to an exterior of said liquid delivering device;
   (b) a piezoelectric actuator unit superposed on said cavity unit, and having a plurality of active portions which correspond to the respective cavities and which are selectively deformable upon application of a drive voltage thereto so as to deliver the liquid from the corresponding cavities to the exterior of said liquid delivering device; and
   (c) a backup plate superposed on said piezoelectric actuator unit such that said piezoelectric actuator unit is interposed between said cavity unit and said backup plate,
   wherein said backup plate is jointed, at least at portions thereof corresponding to peripheries of said cavities, to said piezoelectric actuator unit,
   wherein said piezoelectric actuator unit includes (b-1) a piezoelectric material layer which is deformable upon generation of an electric field therein as a result of the application of the drive voltage to said piezoelectric actuator unit, and (b-2) a flexible layer which is laminated on said piezoelectric material layer so as to be deformable together with deformation of said piezoelectric material layer,
   and wherein said backup plate has a plurality of recesses formed in a surface thereof which is opposed to said piezoelectric actuator unit, such that said recesses are positioned in respective portions of said backup plate which correspond to the respective active portions of said piezoelectric actuator unit.

23. The liquid delivering device according to claim 22, wherein each of said plurality of recesses has a cross sectional area which is as large as a cross sectional area of a corresponding one of said plurality of cavities as viewed in a direction perpendicular to said backup plate.

24. The liquid delivering device according to claim 22, wherein each of said plurality of recesses has a cross sectional area which is larger than a cross sectional area of a corresponding one of said plurality of cavities as viewed in a direction perpendicular to said backup plate.

25. A liquid delivering device comprising:

a cavity unit defining a plurality of cavities for accommodating a liquid which is to be delivered to an exterior of said liquid delivering device;

a piezoelectric actuator unit superposed on said cavity unit, and having a plurality of active portions which correspond to the respective cavities and which are selectively deformable upon application of a drive voltage thereto so as to deliver the liquid from the corresponding cavities to the exterior of said liquid delivering device; and a backup plate superposed on said piezoelectric actuator unit such that said piezoelectric actuator unit is interposed between said cavity unit and said backup plate, wherein said backup plate is jointed, at least at portions thereof corresponding to peripheries of said cavities, to said piezoelectric actuator unit, and wherein said backup plate is spaced apart from said piezoelectric actuator unit at least at portions corresponding to said active portions, and wherein said piezoelectric actuator unit includes a piezoelectric material layer which is deformable upon generation of an electric field therein as a result of the application of the drive voltage to said piezoelectric actuator unit, and a flexible layer which is laminated on said piezoelectric material layer so as to be deformable together with deformation of said piezoelectric material layer.

* * * * *